United States Patent [19]

Kasahara et al.

[11] Patent Number: 4,868,395
[45] Date of Patent: Sep. 19, 1989

[54] ELECTRON BEAM LITHOGRAPHY SYSTEM FOR DELINEATING A DESIRED PATTERN ON A TARGET BY MEANS OF ELECTRON BEAMS

[75] Inventors: Izumi Kasahara; Yasunobu Kawauchi; Yoshio Suzuki, all of Numazu, Japan

[73] Assignee: Toshiba Machine Co., Ltd., Tokyo, Japan

[21] Appl. No.: 168,605

[22] Filed: Mar. 4, 1988

Related U.S. Application Data

[63] Continuation of Ser. No. 799,102, Nov. 18, 1985, abandoned.

[30] Foreign Application Priority Data

Nov. 22, 1984 [JP] Japan ................. 59-247425
Nov. 22, 1984 [JP] Japan ................. 59-247426
Jul. 22, 1985 [JP] Japan ................. 60-161519

[51] Int. Cl.$^4$ ............................................. H01J 37/00
[52] U.S. Cl. ................................. 250/398; 250/492.2
[58] Field of Search .......... 250/492.2, 492.22, 492.23, 250/492.3, 396 R, 398

[56] References Cited

U.S. PATENT DOCUMENTS 4,392,058 7/1983 Smith ................. 250/492.2

FOREIGN PATENT DOCUMENTS 0143322 8/1984 Canada ................. 250/492.2
0116130 6/1985 Canada ................. 250/492.2
10043863 1/1982 European Pat. Off. .
20081283 6/1983 European Pat. Off. .
0150941 8/1985 European Pat. Off. ............ 250/398
2755399 6/1978 Fed. Rep. of Germany .
12755399 6/1978 Fed. Rep. of Germany .

OTHER PUBLICATIONS

Mauer et al., "Electron Optics of an Electron Beam Lithographic System," IBM J. Res. Develop., Electron Optics, Nov. 1977.

Primary Examiner—Bruce C. Anderson
Attorney, Agent, or Firm—Oblon, spivak, McClelland, Maier & Neustadt

[57] ABSTRACT

In a system for continuously exposing desired patterns and their backgrounds on the surface of a target, a first electron beam emitted from a first electron gun is converged by condenser lenses and an objective lens to be focused on the surface of the target. A second electron beam emitted from a second electron gun is defocused at the target surface by a condenser lens and a deflecting coil. A deflector selects the first or second electron beams. While the target surface is being scanned with the selected electron beam, the beam is deflected by a scanning deflector. In delineating a pattern, the target surface is scanned with the first electron beam. In delineating a background, on the other hand, the target surface is scanned with the second electron beam.

7 Claims, 5 Drawing Sheets

ELECTRON BEAM LITHOGRAPHY SYSTEM FOR DELINEATING A DESIRED PATTERN ON A TARGET BY MEANS OF ELECTRON BEAMS

This application is a Continuation of application Ser. No. 799,102, filed on Nov. 18, 1985, now abandoned.

BACKGROUND OF THE INVENTION

The present invention relates to an electron beam lithography system for delineating a desired pattern on a target by means of an electron beam, and more specifically to an electron beam lithography system which can maintain its exposure accuracy despite a proximity effect.

Various electron beam lithography systems have recently been developed which delineate a fine pattern on the surface of a target, such as a semiconductor wafer, mask substrate etc., by means of an electron beam. Since patterns have become finer and finer, electron beam lithography systems need to maintain exposure accuracy in spite of a proximity effect resulting from the electrons scattered in the substrate and in a resist film formed on the surface of the substrate, and from other causes.

Methods of correction of the proximity effect applicable to the electron beam lithography systems include:
 (1) To correct the dose of electron beams applied to the substrate;
 (2) To correct the shape of the pattern formed on the substrate; and
 (3) To form a multilayer resist film on the substrate.

If method (1) is applied to the lithography systems, massive calculation must be performed to obtain the corrected value. Moreover, method (1) cannot be applied to lithography systems of a raster-scanning type. If method (2) is applied, the shapes of pattern must be subjected to a very fine adjustment. Method (3) complicates the processes of coating a resist film and developing patterns.

Thereupon, a fourth method has been proposed. In this method, a background region of the substrate is exposed by a defocused electron beam whose beam current is lower than that of the electron beam for delineating the pattern. This method helps to maintain dimensions of the pattern, despite the electrons scattered from the substrate.

In the prior art electron beam lithography systems, if an electron beam is incident on the resist film formed on the substrate surface, the energy absorbed by the resist film consists of a first component produced by forward scattered electrons and a second component produced by backwardly scattered electrons. The forwardly scattered electrons include the electrons incident on the resist film and the electrons scattered within the resist film. The backwardly scattered electrons are ones scattered back from the substrate. The first component spread within a range of 0.1 to 0.2 micron, and the second component within a range of 1 to 10 microns. These ranges change according to the acceleration of the electron beam. After a pattern has been delineated, the spread of the second component influences the quantity of energy absorbed by a certain portion of the resist film. Due to the spread of the second component, the pattern formed on the substrate cannot have the desired dimensions.

In the fourth method, the background is repeatedly exposed by a defocused electron beam which provides the same absorbed energy quantity distribution as does the second component. Therefore the sum of the second component of the electron beam and a component of the defocused electron beam is uniformly distributed on the surface of the substrate. Thus, the influence of the second component on the pattern dimensions is reduced. Since the spread of the first component can fully be suppressed to 0.1 micron or less by, for example, increasing the acceleration voltage, the fourth method can reduce the proximity effect can, therefore, provide an accurate pattern.

If the fourth method is applied to the lithography systems in practical use, however, the pattern must be first delineated by an electron beam and the background must be then exposed by another electron beam defocused for correction. This would reduce the exposure throughput to half or less.

SUMMARY OF THE INVENTION

The object of the present invention is to provide a lithography system using electron beams and capable of correcting a proximity effect without lowering the exposure throughput, thereby improving the accuracy of pattern formation.

According to the present invention, there is provided a system for continuously exposing desired patterns and their backgrounds on the surface of a target, which comprises a first electron gun for emitting a first electron beam, means for focusing the first electron beam on the surface of the target, a second electron gun for emitting a second electron beam, means for defocusing the second electron beam at the surface of the target, means for selecting the first or second electron beams, and means for deflecting either the first or the second electron beam while the surface of the target is being scanned with the first or second electron beam, whereby the first electron beam is used to scan the target surface in delineating a pattern, and the second electron beam is used in delineating a background.

According to the present invention, moreover, there is provided a system for continuously exposing desired patterns and their backgrounds on the surface of a target, which comprises an electron gun for emitting an electron beam, means for focusing the electron beam on the surface of the target, means for defocusing the electron beam at the surface of the target, means for restricting the current for the electron beam while the electron beam is defocused, and means for deflecting the electron beam while the surface of the target is being scanned with the electron beam, whereby the focused electron beam is used to scan the target surface in delineating a pattern, and the defocused electron beam is used in delineating a background.

DETAILED DESCRIPTION OF THE PREFERRED EMBODIMENTS

Figure 1:
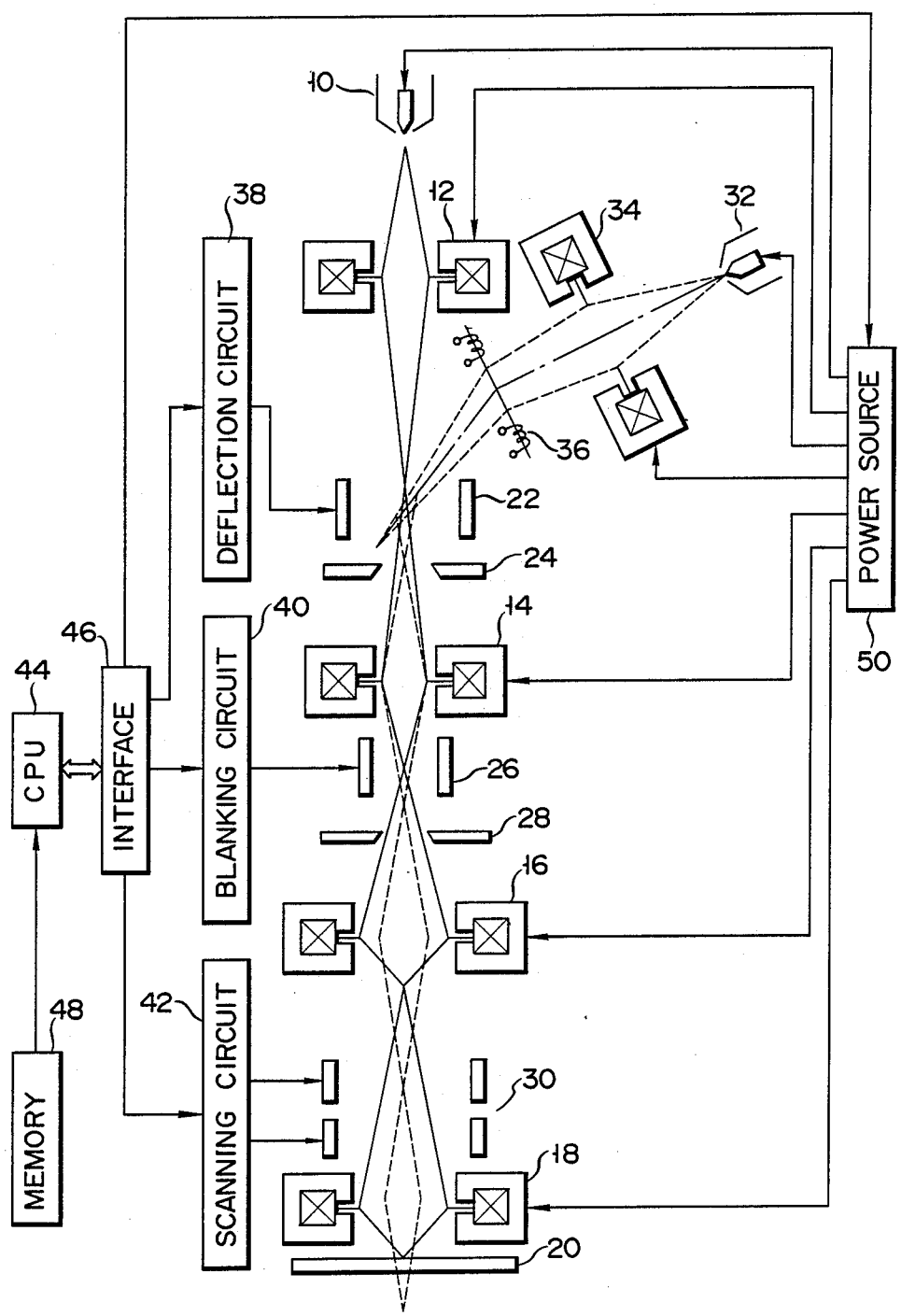
FIG. 1 is a schematic view showing a lithography system according to a first embodiment of the present invention.

FIG. 1 is a schematic view of a lithography system using electron beams according to a first embodiment of the present invention. Below a first electron gun 10 for emitting a first electron beam, there are arranged first, second and third condenser lenses 12, 14 and 16, an objective lens 18, and a substrate (or target) 20 on which a pattern is delineated by electron beams. A deflector 22 is disposed between the first and second condenser lenses 12 and 14 and in the vicinity of an electron beam path along which a crossover image of electron beam is formed. The deflector 22 serves to deflect electron beams, thereby selecting an electron beam to be incident on the substrate 20. Disposed between the deflector 22 and the second condenser lens 14 is a plate 24 on which a nonselected electron beam is to impinge. A blanking electrode 26 for deflecting the electron beams is provided between the second and third condenser lenses 14 and 16. Disposed between the blanking electrode 26 and the third condenser lens 16 is a blanking plate 28 on which the deflected electron beams are to impinge. Arranged between the third condenser lens 16 and the objective lens 18 is scanning deflector 30 for deflecting the electron beams in an X-direction (horizontal direction of FIG. 1) and in a Y-direction (perpendicular to the drawing plane of FIG. 1) above the surface of the substrate 20.

Above the deflector 22, as shown in FIG. 1, there are arranged a second electron gun 32 for emitting a second electron beam, a fourth condenser lens 34 for converging the second electron beam, and a deflecting coil 36 for deflecting the second electron beam. The second electron beam emitted from the second electron gun 32 is directed toward the center of the deflector 22 via the fourth condenser lens 34 and the deflecting coil 36, and caused to cross the first electron beam within the deflector 22. As shown in FIG. 1, these electron lenses and other components are connected to a power source 50 to be driven by power therefrom.

There will now be described the way the substrate 20 is exposed by the electron beam lithography system shown in FIG. 1 using the raster scanning method.

In delineating a pattern, the deflector 22 is supplied with zero voltage from a deflection circuit 38. In this case, the first electron beam emitted from the first electron gun 10, as indicated by full line in FIG. 1, is converged by an electrooptical system, and then focused on the surface of the substrate 20. Namely, the first, second and third condenser lenses 12, 14 and 16 and the objective lens 18 are adjusted so that a crossover image of a predetermined size is formed on the substrate 20 by using a predetermined beam current. Thus, while the deflecting voltage is not being applied to the deflector 22, the second electron beam emitted from the second electron gun 32 impinges on the plate 24, so that only the first electron beam is directed toward the surface of the substrate 20.

In delineating a background, the deflecting voltage is applied from the deflection circuit 38 to the deflector 22. As a result, the first electron beam is deflected to be caused to impinge on the plate 24 without being directed toward the substrate 20. As indicated by broken line in FIG. 1, the second electron beam is deflected to be directed toward the surface of the substrate 20. In this case, the second electron beam is adjusted by the fourth condenser lens 34 so as to be defocused at the surface of the substrate 20 or focused on a point below the substrate 20, and to have a predetermined diameter greater than that of the first electron beam on the surface of the substrate 20, and a predetermined current lower than that of the first electron beam. Thus, the background is exposed to the second electron beam.

During exposure, pattern data in a memory 48 are successively processed by a CPU 44, which gives commands to the deflection circuit 38, a scanning circuit 42, and a blanking circuit 40 through an interface 46 In response to the pattern data, the deflection circuit 38, the blanking circuit 40, and the scanning circuit 42 deliver a deflection signal, a blanking signal, and a scanning signal, respectively.

In accordance with the deflection signal, the deflector 22 selects the electron beam to be directed toward the substrate 20. The first or second electron beam selected by the deflector 22 is deflected in the X-and Y-direction above the substrate 20. Thus, the pattern and background are delineated for each line on the surface of the substrate 20 by the first and second electron beam.

The CPU 44 controls the change of the electron beam to be incident on the surface of the substrate 20, from the first electron beam to the second one. In accordance with the pattern data in the memory 48, the CPU 38 supplies data to the deflection circuit 38 through the interface 46, and the deflection circuit 38 then delivers a deflection signal. In response to this deflection signal, voltage is applied to the deflector 22, so that the electron beams emitted from the first and second electron guns 10 and 32 are deflected. In consequence, the electron beam to be incident on the surface of the substrate 20 is shifted from the first electron beam to the second. When scanning the surface of the substrate 20 once with the electron beam by means of the lithography system, therefore, the deflector 22 is switched on or off by the CPU 44, so that pattern portions of a line are delineated by the first electron beam, while background portions of the same line are exposed to the second electron beam. Thus, unlike the prior art exposure system, the lithography system according to the present invention does not require to scan the substrate along the same scanning line twice by using different beams. Accordingly, the reduction of exposure accuracy due to the proximity effect can be prevented without lowering the delineation throughput.

Figure 2:
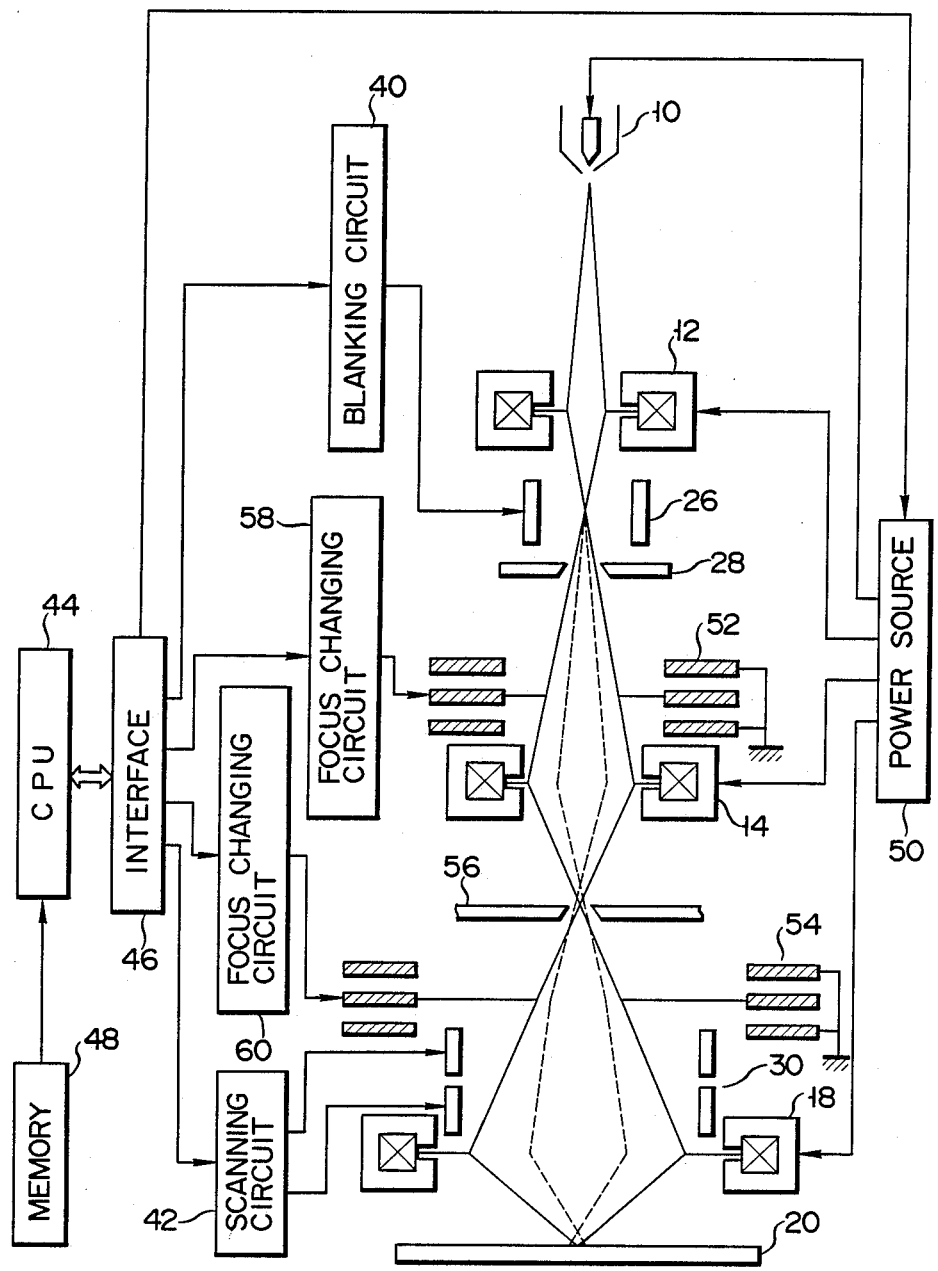
FIG. 2 is a schematic view showing a lithography system according to a second embodiment of the invention.

FIG. 2 shows a lithography system according to a second embodiment of the invention. In FIG. 2, like reference numerals are used to designate like members as shown in FIG. 1, and a description of those members is omitted herein.

Unlike the system of the first embodiment, the lithography system of the second embodiment is provided with the first electron gun 10 only. Disposed between the plate 28 and the second condenser lens 14 is a first high-speed variable-focus lens 52 for converging the electron beam and changing its focal length at high speed. Disposed between the second condenser lens 14 and the beam-scanning deflector 30 is an aperture mask 56 for restricting the current for the electron beam while voltage is applied to the first high-speed variable-focus lens 52, and a second high-speed variable-focus lens 54 for converging the electron beam and changing its focal length at high speed. Voltage is applied to the first high-speed variable-focus lens 52 in response to a focus change signal from a focus changing circuit 58, while voltage is applied to the second high-speed variable-focus lens 54 in response to a focus change signal from another focus changing circuit 60.

The operation of the lithography system according to the second embodiment will now be described. In delineating a pattern on the surface of the substrate 20, no voltage is applied to the high-speed variable-focus lenses 52 and 54, the condenser lenses 12, 14 and the objective lens 18 are adjusted so that the first electron beam emitted from the electron gun 10 is focused on the surface of the substrate 20, as indicated by full line in FIG. 2. At the same time, the focused beam diameter on the substrate 20 and the beam current are adjusted to predetermined values. A scanning signal from the CPU 44 is supplied to the scanning circuit 42 through the interface 46, and voltage is applied to the scanning deflector 30 in response to the scanning signal from the scanning circuit 42. As the scanning deflector 30 is actuated in this manner, the first electron beam is deflected to form the desired pattern on the substrate 20.

In exposing a background, focus change signals from the CPU 44 are supplied to the focus changing circuits 58 and 60 through the interface 46, and voltage is applied to the high-speed variable-focus lenses 52 and 54 in response to the focus change signals. As a result, the focus of the electron beam is placed on a point above the surface of the substrate 20, so that a defocused second electron beam is generated, as indicated by broken line in FIG. 2. The second electron beam which is incident on the surface of the substrate 20 is greater in diameter and lower in current than the first electron beam. In this manner, the background region is exposed to the second electron beam.

Thus, unlike the system of the first embodiment, the lithography system according to the second embodiment can produce either of the first and second electron beams by switching on or off the high-speed variable-focus lenses 52 and 54 without the use of the second electron gun 32.

Figure 3:
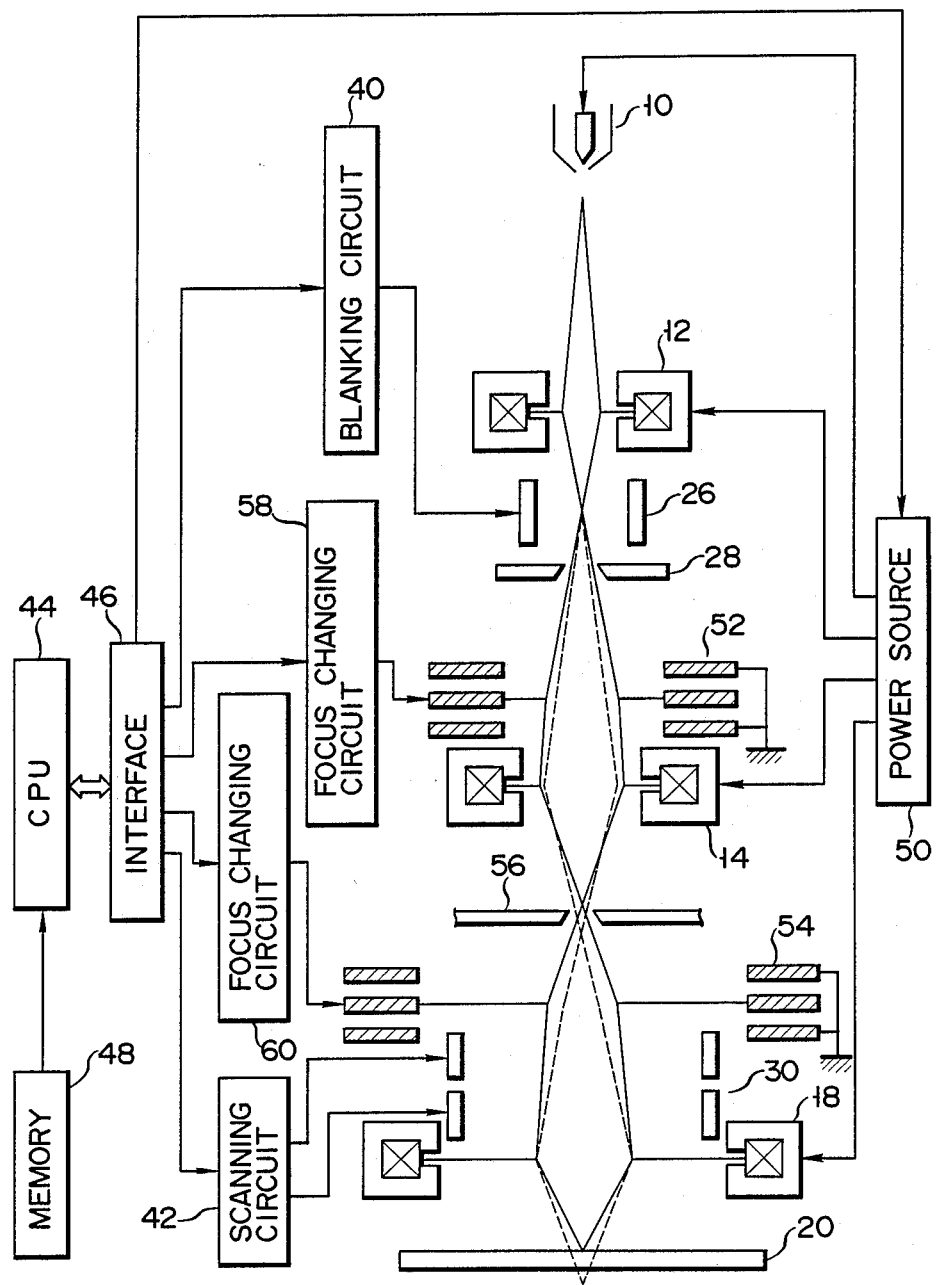
FIG. 3 is a schematic view showing a lithography system according to a third embodiment of the invention.

FIG. 3 is a schematic view of a lithography system according to a third embodiment of the invention. This lithography system has substantially the same construction as the lithography system of the second embodiment. The former differs from the latter only in the on-off conditions of the high-speed variable-focus lenses. Namely, in delineating a pattern on the surface of the substrate 20, in the lithography system of the third embodiment, voltage is applied to the high-speed variable-focus lenses 52 and 54, and the first electron beam behaves as indicated by full line in FIG. 3. In exposing a background on the surface of the substrate 20, on the other hand, no voltage is applied to the variable-focus lenses 52 and 54, and the second electron beam behaves as indicated by broken line in FIG. 3.

Figure 4:
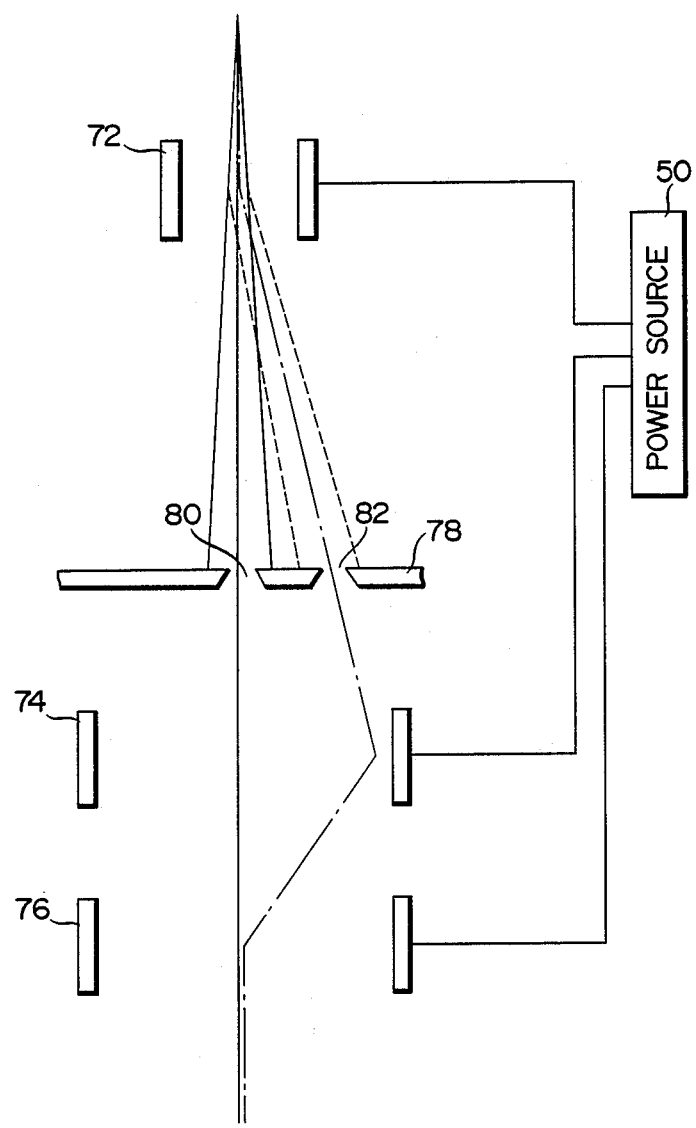
FIG. 4 is a schematic view showing a lithography system according to a fourth embodiment of the invention.

FIG. 4 is a schematic view showing principal parts of a lithography system according to a fourth embodiment of the invention, in which the electron gun, condenser lens, objective lens, CPU, high-speed variable-focus lenses, etc., are omitted. As shown in FIG. 4, the lithography system comprises deflectors 72, 74 and 76 each including an electrostatic lens. An aperture mask 78 for limiting beam current is disposed between the deflectors 72 and 74. The aperture mask 78 has a first aperture 80 and a second aperture 82 smaller in diameter than the first aperture 80. In delineating a pattern on the surface of the substrate (not shown), no voltage is applied to the deflectors 72, 74 and 76, and no voltage to the high-speed variable-focus lenses (not shown) either. Accordingly, the electron beam omitted from the electron gun passes through the first aperture 80 and is focused by the objected lens to form a first electron beam, as indicated by full line in FIG. 4, which is incident on the surface of the substrate. In exposing a background, voltage is applied to the deflectors 72, 74 and 76, and also to the high-speed variable-focus lenses. In this case, the electron beam emitted from the electron gun is deflected by the deflector 72, as indicated by broken line in FIG. 4, and passes through the second aperture 82. Further, the electron beam is deflected successively by the deflectors 74 and 76 to be directed toward the surface of the substrate, and is defocused by the high speed variable-focus lens. Thus, since the second aperture 82 through which the second electron beam passes is narrower than the first aperture 80, that part of the second beam intercepted by the aperture mask 78 is greater than that of the first electron beam. As a result, the beam current of the second electron beam is made less than that of the first electron beam, and the diameter of the second electron beam which is incident on the surface of the substrate 20 is increased by the agency of the high-speed variable-focus lenses. Thus, the first electron beam for delineating the pattern and the second electron beam for exposing the background may be obtained by switching on or off the deflectors 72, 74 and 76 and the high-speed variable-focus lenses.

In the second, third and fourth embodiments, the high-speed variable-focus lenses may be three in number, and their locations may be changed as required. The positions of the apertures 78 may also be changed according to circumstances.

Figure 5:
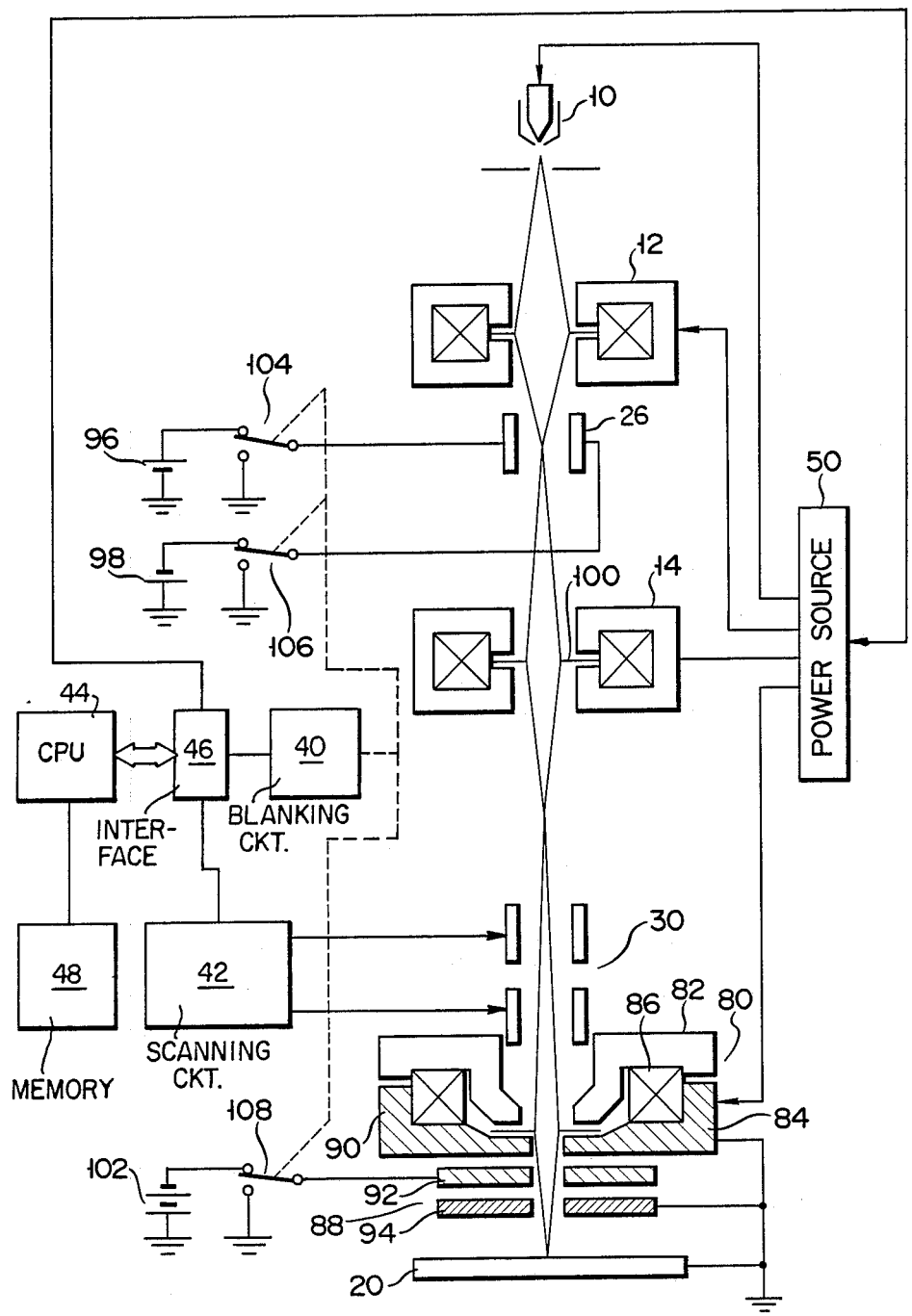
FIG. 5 is a schematic view showing a lithography system according to a fifth embodiment of the invention.

FIG. 5 is a schematic view of a lithography system according to a fifth embodiment of the invention. In FIG. 5, like reference numerals are used to designate like members as shown in FIG. 1. The lithography system of the fifth embodiment comprises an objective lens 80 located below the scanning deflector 30. The objective lens 80 includes an upper lens electrode 82 and a lower lens electrode 84, between which an electromagnetic coil 86 is interposed. An electrostatic lens 88 formed of a so-called Einzel lens is disposed under the objective lens 80. The electrostatic lens 88 includes first, second and third electrodes 90, 92 and 94. The electrostatic lens 88 can serve as a lens on condition that the first and third electrodes 90 and 94 have the same potential, and that the second and third electrodes 92 and 94 have different potentials. The first electrode 90 of the electrostatic lens 88 is formed integrally with the lower lens electrode 84 of the objective lens 80, and the first and third electrodes 90 and 94 of the electrostatic lens 88 are grounded.

When voltage is applied from power sources 96 and 98 to the blanking electrode 26, part of the electron beam is caused to impinge on an aperture member 100 attached to the condenser lens 14, to be intercepted by the aperture member 100. A negative voltage is supplied from a power source 102 to the second electrode 92. Numerals 104, 106 and 108 designate switches of the power sources 96, 98 and 102, respectively.

The operation of the lithography system according to the fifth embodiment will now be described.

In delineating a pattern on the surface of the substrate 20, no voltage is applied to the second electrode 92 of the electrostatic lens 88. The exciting current of the condenser lens 14 is adjusted to set the spread angle of the first electron beam emitted from the electron gun 10, and the exciting current of the objective lens 80 is adjusted to focus the first electron beam on the surface of the substrate 20.

In exposing a background on the surface of the substrate 20, a predetermined negative voltage is applied to the second electrode 92 of the electrostatic lens 88. The electron beam emitted from the electron gun 10 is deflected by the agency of the electrostatic lens 88 to form a second electron beam. The second electron beam is defocused at the surface of the substrate 20. In this case, moreover, voltage is applied to the blanking electrode 26, and part of the second electron beam is intercepted by the aperture member 100 of the condenser lens 14, so that the beam current of the second electron beam is reduced. Accordingly the second electron beam is which the surface of the substrate 20 is exposed is greater in diameter and less in beam current than the first electron beam.

Thus, the switching between the first and second electron beams can easily be accomplished by turning the electrostatic lens 88 on or off. In doing this, the conditions of the condenser lenses 12 and 14 and the objective lens 80 undergo no change, so that the electron beam will never move or rotate. Moreover, the lithography system of the fifth embodiment, which can be manufactured by only adding the electrostatic lens 88 to a prior art lithography system, is simple in construction.

In the fifth embodiment, the lithography system does not require to scan the substrate along the same scanning line twice by using different beams. Alternatively, however, the electron beam may be applied twice to the surface of the substrate 20, first for the delineation of the pattern and then for the exposure of the background. The present invention may be applied not only to the raster scanning method but also to the vector scanning method. In the vector scanning method, only the peripheral region of the pattern may be exposed instead of exposing the whole background. In the fifth embodiment, the first electrode 90 of the electrostatic lens 88 and the lower electrode 84 of the objective lens 80 are formed integrally. Alternatively, the electrostatic lens 88 may be provided independently of the objective lens 80, and its location may be changed as required. Also, a positive voltage may be applied to the second electrode 92 of the electrostatic lens 88. It is to understood that the present invention is not limited to the embodiments described above, and that various changes and modifications may be effected therein by one skilled in the art without departing from the scope or spirit of the invention.

What is claimed is:

1. A system for continuously exposing desired patterns and their backgrounds on a target surface, comprising:
    an electron gun for emitting an electron beam;
    means for blanking the electron beam, which includes a blanking electrode and an aperture member;
    means for generating a halfblanking signal to be supplied to the blanking electrode, a part of the electron beam being intercepted when the half-blanking signal is applied to the blanking electrode;
    means for focusing the electron beam on the surface of the target, which includes an objective lens and a condenser lens for converging the electron beam on the target surface;
    means for defocusing the electron beam on the target surface which is located between the objective lens and the target surface, including an electrostatic lens for converging the electron beam on the target surface;
    means for deflecting the electron beam to scan the target surface with the electron beam, the pattern being delineated by the focused electron beam, and the background being delineated by the defocused electron beam on the target surface; and
    means for concurrently applying said half-blanking signal to the blanking electrode and a defocusing signal to said defocusing means during scanning of the background on the target surface so that the background is scanned with a weakened defocused electron beam.

2. The system according to claim 1, further comprising a memory stored with pattern data and means for giving command signals to the defocusing means, the applying means and the deflecting means in accordance with the data delivered from the memory.

3. The system according to claim 1, further comprising restricting means including an aperture for intercepting part of the defocused electron beam to restrict the current thereof in delineating the background.

4. The system according to claim 1, wherein said electrostatic lens is an Einzel lens.

5. The system according to claim 1, wherein the electrostatic lens has a first electrode which functions as an electrode of the objective lens, and second and third electrodes.

6. The system according to claim 5, further comprising means for generating a defocusing signal to be applied to the second electrode.

7. The system according to claim 5, wherein the first and third electrodes are maintained at the same potential.

* * * * *